(12) United States Patent
Cheng

(10) Patent No.: US 9,354,274 B2
(45) Date of Patent: May 31, 2016

(54) CIRCUIT TEST SYSTEM ELECTRIC ELEMENT MEMORY CONTROL CHIP UNDER DIFFERENT TEST MODES

(75) Inventor: Wen-Chang Cheng, Taoyuan County (TW)

(73) Assignee: NANYA TECHNOLOGY CORPORATION, Taoyuan (TW)

( * ) Notice: Subject to any disclaimer, the term of this patent is extended or adjusted under 35 U.S.C. 154(b) by 683 days.

(21) Appl. No.: 13/584,792

(22) Filed: Aug. 13, 2012

(65) Prior Publication Data

US 2014/0046616 A1 Feb. 13, 2014

(51) Int. Cl.
*G01R 31/28* (2006.01)
*G01R 31/317* (2006.01)
*G11C 29/12* (2006.01)
*G11C 29/14* (2006.01)

(52) U.S. Cl.
CPC .... *G01R 31/31712* (2013.01); *G01R 31/31725* (2013.01); *G01R 31/31727* (2013.01); *G11C 29/12015* (2013.01); *G11C 29/14* (2013.01); *G01R 31/31716* (2013.01); *G01R 31/31717* (2013.01)

(58) Field of Classification Search
CPC ............... G01R 31/002; G01R 31/28; G01R 31/31712–31/31717; G01R 31/31725; G01R 31/31727; H04B 17/14; H04B 17/402; H04B 17/405; G11C 29/12; G11C 29/1201; G11C 29/12015; G11C 29/14
USPC ........................................................ 702/120
See application file for complete search history.

(56) References Cited

U.S. PATENT DOCUMENTS

| 5,208,838 | A | * | 5/1993 | Wendell et al. ............... 375/354 |
| 6,381,722 | B1 | * | 4/2002 | Salmon .............. G01R 31/3016 714/738 |
| 6,421,801 | B1 | * | 7/2002 | Maddux .............. G01R 31/319 714/744 |
| 7,269,772 | B1 | * | 9/2007 | Li .................... G01R 31/31725 714/731 |

(Continued)

FOREIGN PATENT DOCUMENTS

| CN | 1471640 | 1/2004 |
| KR | 1020010033037 | 4/2001 |

(Continued)

OTHER PUBLICATIONS

"Office Action of Taiwan Counterpart Application", issued on Feb. 24, 2014, p. 1-p. 6.

(Continued)

*Primary Examiner* — John Breene
*Assistant Examiner* — Lynda Dinh
(74) *Attorney, Agent, or Firm* — Jianq Chyun IP Office

(57) ABSTRACT

A circuit test system including a circuit test apparatus and a circuit to be tested is provided. The circuit test apparatus provides a first clock signal. The circuit to be tested includes a plurality of input/output pads and at least one clock pad. At least two input/output pads of the input/output pads are connected to each other to form a test loop during a test mode. The clock pad receives the first clock signal. The circuit to be tested multiplies a frequency of the first clock signal to generate a second clock signal, and the test loop of the circuit to be tested is tested based on the second clock signal during the test mode. The frequency of the second clock signal is higher than that of the first clock signal. Furthermore, a circuit test method of the foregoing circuit test system is also provided.

17 Claims, 2 Drawing Sheets

(56) References Cited

U.S. PATENT DOCUMENTS

| | | | |
|---|---|---|---|
| 7,489,173 B1* | 2/2009 | Verma | H03K 5/1565 327/175 |
| 8,049,569 B1* | 11/2011 | Wright | H03L 7/104 331/161 |
| 2003/0041296 A1 | 2/2003 | Bos et al. | |
| 2007/0245200 A1 | 10/2007 | Hattori et al. | |
| 2008/0005634 A1 | 1/2008 | Grise et al. | |
| 2008/0133167 A1* | 6/2008 | Fleury | G01R 31/318552 702/120 |
| 2013/0116961 A1* | 5/2013 | Elrabaa | G01R 31/28 702/120 |
| 2013/0218508 A1* | 8/2013 | Jindal | G05B 1/00 702/120 |

FOREIGN PATENT DOCUMENTS

| | | |
|---|---|---|
| TW | 200617977 | 6/2006 |
| TW | 200703354 | 1/2007 |
| TW | 200724950 | 7/2007 |
| TW | 200809234 | 2/2008 |
| TW | 200809235 | 2/2008 |
| TW | 201129893 | 9/2011 |

OTHER PUBLICATIONS

"Office Action of China Counterpart Application", issued on Jul. 30, 2015, p. 1-p. 7.

* cited by examiner

CIRCUIT TEST SYSTEM ELECTRIC ELEMENT MEMORY CONTROL CHIP UNDER DIFFERENT TEST MODES

BACKGROUND OF THE INVENTION

1. Field of the Invention

The invention relates to a test system and a test method thereof, and more particularly relates to a circuit test system and a circuit test method thereof.

2. Description of Related Art

Advance in technology has enabled the high speed electronic circuit. Thanks to the well researched and developed electronic devices, such as microprocessors and memories, it is possible for the electronic circuit to operate in the high speed environment but still keep the good performance. However, to test the input and output of the electronic circuit at high speed, a high speed tester is needed. For testing the electronic circuit, the high speed tester would generate data pattern which has a data rate high than 6 Gbps. Since the high speed tester is expensive, the need of the high speed tester should be avoided while the electronic circuit is tested.

Furthermore, the conventional test method simply tests off-chip drivers and receivers of the electronic circuit, and other electric elements such as clock receivers, first-in-first-out (FIFO) buffers, serial-to-parallel converters, clock trees and packages are not tested. An economical method for testing electronic circuits at high speed is necessary for cost down.

SUMMARY OF THE INVENTION

The invention is directed to a circuit test system capable of providing a high speed testing function.

The invention is directed to a circuit test method capable of providing a high speed testing function.

The invention provides a circuit test system including a circuit test apparatus and a circuit to be tested. The circuit test apparatus provides a first clock signal. The circuit to be tested is coupled to the circuit test apparatus. The circuit to be tested includes a plurality of input/output pads and at least one first clock pad. At least two first input/output pads of the input/output pads are connected to each other to form a first test loop during a first test mode. The first clock pad receives the first clock signal. The circuit to be tested multiplies a frequency of the first clock signal to generate a second clock signal, and the first test loop of the circuit to be tested is tested based on the second clock signal during the first test mode.

In an embodiment of the invention, the circuit to be tested further includes at least one second clock pad. The second clock pad is connected to at least one second input/output pad of the input/output pads to form a second test loop during a second test mode. The first test loop and the second test loop of the circuit to be tested are tested based on the second clock signal during the second test mode.

In an embodiment of the invention, the circuit to be tested further includes a plurality of input/output interface units. Each of input/output interface units is coupled to a corresponding one of the input/output pads or the second clock pad for transmitting data to the corresponding input/output pad and receiving data from the corresponding input/output pad or the second clock pad.

In an embodiment of the invention, each of the input/output interface units coupled to the corresponding one of the input/output pads includes a reception unit and a transmission unit. The reception unit is coupled to the corresponding input/output pad and receives data from the corresponding input/output pad. The transmission unit is coupled to the corresponding input/output pad and transmits data to the corresponding input/output pad. The reception unit of one of the two first input/output pads is located in the first test loop, and the transmission unit of another one of the two first input/output pads is located in the first test loop.

In an embodiment of the invention, the input/output interface unit coupled to the second clock pad includes a reception unit. The reception unit is coupled to the second clock pad and receives data from the second clock pad. The reception unit of the second clock pad is located in the second test loop, and the transmission unit of the second input/output pad is located in the second test loop.

In an embodiment of the invention, the circuit to be tested further includes a data register unit. The data register unit is coupled to the input/output interface units. The data register unit receives data from the input/output interface units based on a first write clock and outputs data to the input/output interface units based on a read clock.

In an embodiment of the invention, the circuit to be tested further includes a clock generation unit. The clock generation unit is coupled between the data register unit and the circuit test apparatus. The clock generation unit multiplies the frequency of the first clock signal to generate the second clock signal and provides the second clock signal to serve as the first write clock and the read clock.

In an embodiment of the invention, the clock generation unit includes a clock multiplying unit, the read clock generation unit, and a write clock generation unit. The clock multiplying unit is coupled to the circuit test apparatus and multiplies the frequency of the first clock signal to generate the second clock signal. The read clock generation unit is coupled to the data register unit and provides the read clock based on the second clock signal. The write clock generation unit is coupled to the data register unit and provides the first write clock based on the second clock signal or a second write clock.

In an embodiment of the invention, the clock generation unit further includes a selection unit. The selection unit is coupled between the clock multiplying unit and the write clock generation unit. The selection unit selects one of the second clock signal and the second write clock and provides the selected one to the write clock generation unit. The second write clock is transmitted from the second test loop to the selection unit.

In an embodiment of the invention, the clock generation unit further includes a delay unit. The delay unit is coupled between the write clock generation unit and the clock multiplying unit and delays the second clock signal or the second write clock for an adjustable period.

The invention provides a circuit test method which is adapted to test a circuit to be tested. The circuit to be tested includes a first test loop and a second test loop. The circuit test method includes following steps. A first clock signal from a circuit test apparatus is received. A frequency of the first clock signal to generate a second clock signal is multiplied. The first test loop of the circuit to be tested is tested based on the second clock signal during a first test mode.

In an embodiment of the invention, the step of testing the first test loop of the circuit to be tested based on the second clock signal during the first test mode includes following steps. A read clock and a first write clock to the first test loop are provided based on the second clock. Data from a data register unit is transmitted to a first transmission unit, at least two first input/output pads, a first reception unit, and back to the data register unit based on the read clock and the first write clock. The data register unit, the first transmission unit, the two first input/output pads, and the first reception unit are located in the first test loop. The first transmission unit is coupled to one of the two first input/output pads. The first reception unit is coupled to another one of the two first input/output pads. The two first input/output pads are connected to each other.

In an embodiment of the invention, the step of testing the first test loop of the circuit to be tested based on the second clock signal during the first test mode further includes following steps. The second clock signal is delayed for an adjustable period to provide the first write clock.

In an embodiment of the invention, the circuit test method further includes following steps. The first test loop and the second test loop of the circuit to be tested are tested based on the second clock signal during a second test mode.

In an embodiment of the invention, the step of testing the first test loop and the second test loop of the circuit to be tested based on the second clock signal during the second test mode includes following steps. A read clock and a first write clock to the first test loop are provided based on the second clock. Data from a data register unit is transmitted to a first transmission unit, at least two first input/output pads, a first reception unit, and back to the data register unit based on the read clock and the first write clock. The data register unit, the first transmission unit, the two first input/output pads, and the first reception unit are located in the first test loop, the first transmission unit is coupled to one of the two first input/output pads, the first reception unit is coupled to another one of the two first input/output pads, and the two first input/output pads are connected to each other.

In an embodiment of the invention, the step of testing the first test loop and the second test loop of the circuit to be tested based on the second clock signal during the second test mode further includes following steps. The second clock signal is delayed for an adjustable period to provide the first write clock.

In an embodiment of the invention, the step of testing the first test loop and the second test loop of the circuit to be tested based on the second clock signal during the second test mode further includes following steps. The read clock is provided to the second test loop based on the second clock. Data from the data register unit is transmitted to a second transmission unit, at least one second input/output pad, at least one clock pad, a second reception unit, and back to the data register unit based on the read clock. The data register unit, the second transmission unit, the second input/output pad, the clock pad, and the second reception unit are located in the second test loop. The second transmission unit is coupled to the at least one second input/output pad. The second reception unit is coupled to the at least one clock pad. The second input/output pad and the at least one clock pad are connected to each other.

In an embodiment of the invention, the step of testing the first test loop and the second test loop of the circuit to be tested based on the second clock signal during the second test mode further includes following steps. A second write clock is provided to serve as the write clock. The second write clock is transmitted from the second test loop to the first test loop.

In an embodiment of the invention, the step of testing the first test loop and the second test loop of the circuit to be tested based on the second clock signal during the second test mode further includes following steps. The second write clock is delayed for an adjustable period to serve as the first write clock.

To sum up, in the exemplary embodiments of the invention, the test loops are formed from one input/output pad back to another input/output pad, and certain two input/output pads are chosen to drive specific data patterns to generate the write clock signal. The electric elements located in the first test loop and the second test loop are tested at high speed.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
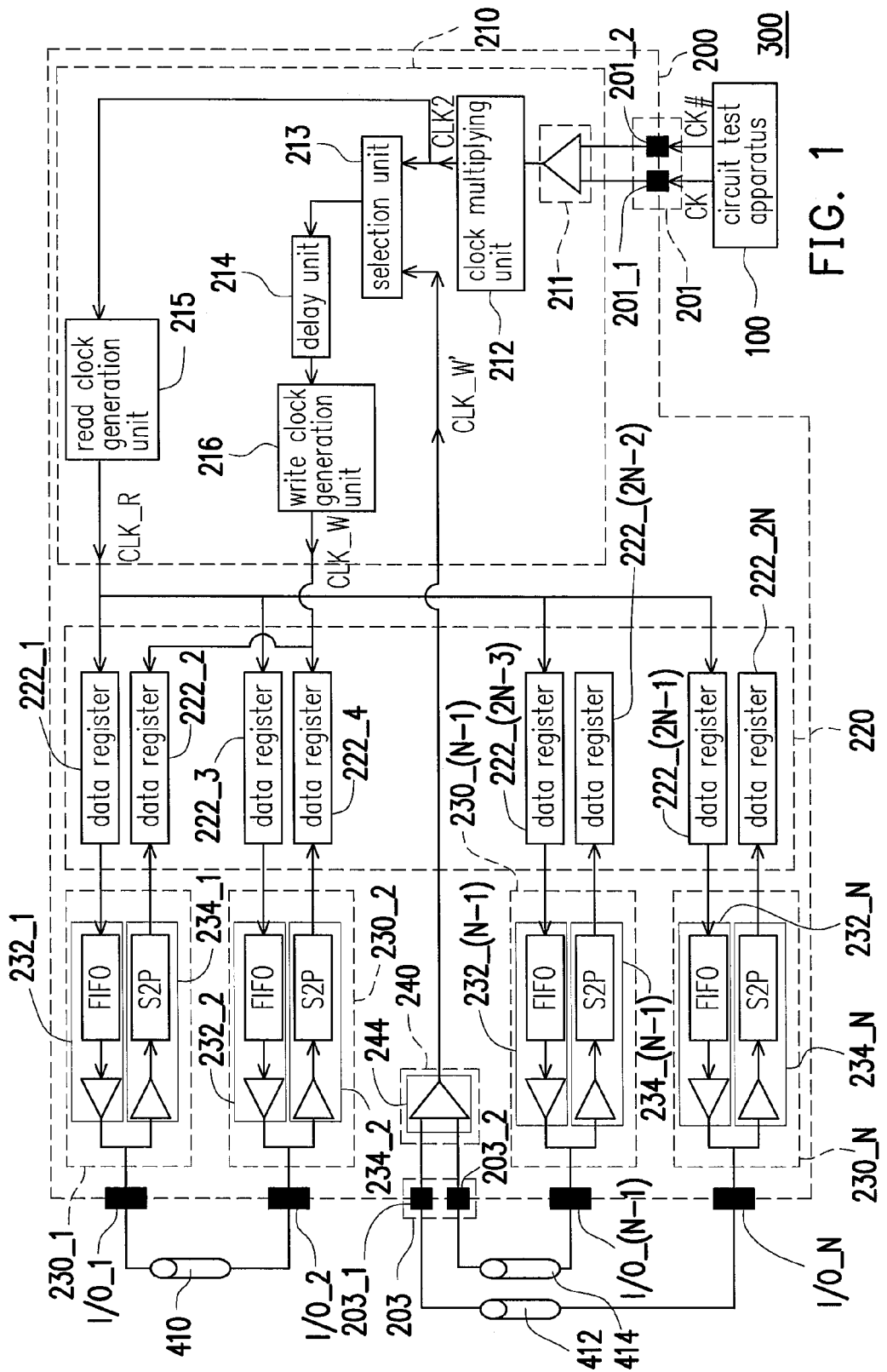
FIG. 1 shows a block diagram of a circuit test system according to an embodiment of the invention.

FIG. 1 shows a block diagram of a circuit test system according to an embodiment of the invention. Referring to FIG. 1, the circuit test system 300 of the present embodiment includes a circuit test apparatus 100 and a circuit to be tested 200. The circuit test apparatus 100 is configured to provide a first clock signal CK and CK# to the circuit to be tested 200 for circuit testing. In this embodiment, the first clock signal may be a par of differential clock signals CK and CK# for example, but the invention is not limited thereto. Herein, the clock signal CK# has an inverse phase relative to that of the clock signal CK. The circuit to be tested 200 includes a plurality of input/output pads I/O_1 to I/O_N, at least one first clock pad 201, and at least one second clock pad 203, where N is an integer, and N>1. In this embodiment, since the first clock signal is the pair of differential clock signal CK and CK#, the at least one first clock pad 201 includes two clock pads 201_1 and 201_2 for receiving the differential clock signals CK and CK# respectively. Furthermore, the at least one second clock pad 203 also includes two clock pads 203_1 and 203_2 for receiving another differential clock signals respectively when the circuit to be tested 200 normally operates. In the present embodiment, the circuit to be tested 200 may be a GDDR5 memory control chip, and the another differential clock signals may be a write clock of the GDDR5 memory control chip, but the invention is not limited thereto.

In the present embodiment, the circuit to be tested 200 may be tested under two different test modes. Under the test modes, one of the input/output pads I/O_1 to I/O_N is connected to another one of the input/output pads I/O_1 to I/O_N via a trace 410 such as a transmission line or an electric device laid on a printed circuit board to form a first test loop. For example, the input/output pad I/O_1 and the input/output pad I/O_2 are connected to each other via the trace 410 in this case. The trace 410 is configured to transmit signals from the input/output pad I/O_1 back to the input/output pad I/O_2. Furthermore, the clock pads 203_1 and 203_2 are also connected to the input/output pad I/O_(N−1) and the input/output pad I/O_N respectively to form a second test loop under the test modes in this embodiment. Under the test modes, the circuit to be tested 200 multiplies a frequency of the first clock signal CK and CK# to generate a second clock signal CLK2 for circuit testing. The second clock signal CLK2 has a frequency higher than that of the first clock signal CK and CK#. Accordingly, the circuit test system 300 is capable of providing a high speed circuit testing. In the present embodiment, the first test loop of the circuit to be tested 200 is tested based on the second clock signal CLK2 during a first test mode, and the first test loop and the second test loop of the circuit to be tested 200 are both tested based on the second clock signal CLK2 during a second test mode.

Specifically, the circuit to be tested 200 further includes a clock generation unit 210, a data register unit 220, and a plurality of input/output interface units 230_1 to 230_N and 240. The clock generation unit 210 is coupled between the data register unit 220 and the circuit test apparatus 100 and configured to multiply the frequency of the first clock signal CK and CK# to generate the second clock signal CLK2 and provide the second clock signal CLK2 to serve as the write clock CLK_W and the read clock CLK_R. In this embodiment, the clock generation unit includes a reception unit 211, a clock multiplying unit 212, a selection unit 213, a delay unit 214, a read clock generation unit 215, and a write clock generation unit 216. The reception unit 211 includes an input buffer for receiving the first clock signal CK and CK# via the clock pads 201_1 and 201_2 and accordingly outputting a single clock signal to the clock multiplying unit 212. The clock multiplying unit 212 is coupled to the circuit test apparatus 100 via the reception unit 211 and configured to multiply the frequency of said single clock signal by N to generate the second clock signal CLK2. Herein, N is a number larger than 1, and thus the frequency of the second clock signal CLK2 is higher than that of the first clock signal CK and CK#. In this case, the clock multiplying unit 212 may be implemented by a phase-locked loop (PLL), but the invention is not limited thereto. Next, the generated second clock signal CLK2 is outputted to the read clock generation unit 215 and the selection unit 213 respectively. The read clock generation unit 215 is coupled between the clock multiplying unit 212 and the data register unit 220 and configured to provide the read clock CLK_R to the data register unit 220 based on the second clock signal CLK2. The read clock CLK_R may be a clock tree to be provided to a plurality data registers of the data register unit 220.

On the other hand, the selection unit 213 is coupled between the clock multiplying unit 212 and the delay unit 214. The selection unit 213 is configured to select the second clock signal CLK2 or the write clock CLK_W' and provide the selected one to the write clock generation unit 216 via the delay unit 214. Next, to coordinate with the read clock CLK_R, the delay unit 214 delays the second clock signal CLK2 or the write clock CLK_W' for an adjustable period and outputs the delayed one to the write clock generation unit 216. The write clock generation unit 216 is coupled between the delay unit 214 and the data register unit 220 and configured to provide the write clock CLK_W to the data register unit 220 based on the second clock signal CLK2 or the second write clock CLK_W'. The write clock CLK_W may be a clock tree to be provided to the plurality data registers of the data register unit 220. In the present embodiment, the selection unit 213 selects and provides the second clock signal CLK2 to the write clock generation unit 216 during the first test mode, and the selection unit 213 selects and provides the write clock CLK_W' to the write clock generation unit 216 during the second test mode.

In the present embodiment, the data register unit 220 is coupled to between the input/output interface units and includes a plurality of data registers 222_1 to 222_2N. Each of the data registers 222_1 to 222_2N is configured to receive data from the input/output interface units 230_1 to 230_N based on the write clock CLK_W and outputting data to the input/output interface units 230_1 to 230_N based on the read clock CLK_R. The data registers 222_1 to 222_2N determine the outputted data pattern based on the read clock CLK_R in this case. For example, in order to test the data registers 222_(2N−3) and 222_(2N−1), the transmission units 232_(N−1) and 232_N, the clock pads 203_1 and 203_2, and the input/output interface unit 240 which are located in the second test loop, the data registers 222_(2N−3) and 222_(2N−1) may respectively determine the outputted data pattern as "0101 . . . " and "1010 . . . " based on the read clock CLK_R, so that the input/output interface unit 240 outputs the write clock CLK_W' to the selection unit 213.

In the present embodiment, each of the input/output interface units 230_1 to 230_N and 240 is coupled to a corresponding one of the input/output pads I/O_1 to I/O_N or the clock pads 203_1 and 203_2 for transmitting data to the corresponding input/output pad and receiving data from the corresponding input/output pad or the clock pads 203_1 and 203_2. In detail, regarding the input/output interface units 230_1 to 230_N, each of the input/output interface units 230_1 to 230_N includes a reception unit and a transmission unit. Each of the reception unit includes an input buffer and a serial-to-parallel converter S2P. The input buffer is coupled to the corresponding input/output pad and receives data from the corresponding input/output pad. The serial-to-parallel converter S2P is coupled to a corresponding data register of the data register unit 220 and converts input serial data into output parallel data. Each of the transmission unit includes an output buffer and a first-in-first-out (FIFO) buffer FIFO. The output buffer is coupled to the corresponding input/output pad and transmits data to the corresponding input/output pad. The first-in-first-out buffer FIFO is coupled to a corresponding data register of the data register unit 220, and data stored in the first-in-first-out buffer FIFO is sent out by a first-in-first-out rule. For example, the input/output interface unit 230_1 includes the reception unit 234_1 and the transmission unit 232_1, the input/output interface unit 230_(N−1) includes the reception unit 234_(N−1) and the transmission unit 232_(N−1), and the input/output interface unit 230_N includes the reception unit 234_N and the transmission unit 232_N. The reception unit 234_1 is coupled to the input/output pad I/O_1 for receiving data from the input/output pad I/O_1. The transmission unit 232_1 is also coupled to the same input/output pad I/O_1 for transmitting data to the input/output pad I/O_1. The connection relationship between other input/output interface units and input/output pads can be deduced by analogy according to FIG. 1, and it will not be described herein. Regarding the input/output interface unit 240, the input/output interface unit 240 includes a reception unit 244 for receiving data from the clock pads 203_1 and 203_2. The reception unit 244 may be implemented by an input buffer and output the write clock signal CLK_W' to the selection unit 213 according to the data received from the clock pads 203_1 and 203_2.

In order to fully convey the spirit of the disclosure, exemplary embodiments of testing the circuit to be tested 200 under the first test mode and the second test mode are respectively described in detail below with reference of figures.

Regarding the first test mode, the first test loop is tested based on the second clock signal CLK2 during the first test mode, and any two of the input/output pads I/O_1 to I/O_N are connected with each other via a trace to form a test loop. For example, the input/output pads I/O_1 and I/O_2 are connected with each other via the trace 410 to form a test loop. In this embodiment, the clock generation unit 210, the data register unit 220, the input/output interface units 230_1 and 230_2, and the input/output pads I/O_1 and I/O_2 are located in the first test loop. In other embodiments, except for the input/output interface units 230_1, 230_2, 230_13 (N−1), and 230_N, and the input/output pads I/O_1, I/O_2, I/O_(N−1) and I/O_N, when the two neighboring input/output interface units and the corresponding input/output pads are tested, the first test loop may include the clock generation unit 210, the data register unit 220, the two neighboring input/output interface units, and the corresponding input/output pads instead of the input/output interface units 230_1 and 230_2 and the input/output pads I/O_1 and I/O_2. It should be noted that for forming the first test loop, the input/output pad to be tested is not limited to connect with the neighboring input/output pad, and said input/output pad to be tested may also connect with other input/output pad except for the input/output pad neighboring with said input/output pad to be tested.

Under the first test mode, the second clock signal CLK2 is transmitted to the read clock generation unit 215, and thus the read clock generation unit 215 generates the read clock CLK_R to the data register 222_1. Next, the data register 222_1 outputs test data to the transmission unit 232_1 based on the read clock CLK_R. The test data is transmitted from the transmission unit 232_1 to the reception unit 234_2 via the input/output pads I/O_1 and I/O_2 and the trace 410. Thereafter, the data register 222_4 receives the test data from the reception unit 234_2 based on the write clock signal CLK_W. On the other hand, the selection unit 213 selects and outputs the second clock signal CLK2 to the delay unit 214 and the write clock generation unit 216 during the first test mode. The delay unit 214 delays and outputs the second clock signal CLK2 to the write clock generation unit 216. Accordingly, the write clock generation unit 216 generates the write clock signal CLK_W based on the second clock signal CLK2, and the write clock signal CLK_W is outputted to the data register 222_4. Furthermore, the test data may also be transmitted from the transmission unit 232_2 to the reception unit 234_1 via the input/output pads I/O_1 and I/O_2 and the trace 410 during the first test mode. In this case, the data register 222_3 outputs the test data based on the read clock CLK_R, and the data register 222_2 receives the test data based on the write clock CLK_W. Accordingly, the electric elements located in the first loop are tested at high speed under the first test mode.

In this embodiment, the input/output interface units 230_1 and 230_2 and the input/output pads I/O_1 and I/O_2 are exemplary for the description of circuit testing, and the circuit testing for other input/output pads and input/output interface units can also be deduced by analogy according to the foregoing description.

Regarding the second test mode, the first test loop and the second test loop are tested based on the second clock signal CLK2 during the second test mode. The test of the first test loop during the second test mode is similar to that of the first test loop during the first test mode, and it will not be described herein. The test of the second test loop during the second test mode will be described in the following. For testing the second test loop, the input/output pads I/O_(N−1) and I/O_N are respectively connected with the clock pads 203_2 and 203_3 via the traces 414 and 412 to form a test loop. In this embodiment, the data register unit 220, the input/output interface units 230_(N−1) and 230_N, and the input/output pads I/O_(N−1) and I/O_N are located in the second test loop.

Under the second test mode, the second clock signal CLK2 is also transmitted to the read clock generation unit 215, and thus the read clock generation unit 215 generates the read clock CLK_R to the data registers 222_(2N−3) and 222_(2N−1). Next, the data registers 222_(2N−3) and 222_(2N−1) respectively output test data to the input/output interface units 230_(N−1) and 230_N based on the read clock CLK_R. In the present embodiment, in order to output the write clock CLK_W' to the selection unit 213, the data registers 222_(2N−3) and 222_(2N−1) respectively determines the outputted data pattern as "0101 . . . " and "1010 . . . " based on the read clock CLK_R. The test data is transmitted from the transmission units 232_(N−1) and 232_N to the reception unit 244 via the input/output pads I/O_(N−1) and I/O_N, the traces 412 and 414, and the clock pads 203_1 and 203_2. Thereafter, the reception unit 244 receives said test data from the clock pads 203_1 and 203_2 and outputs the write clock signal CLK_W' to the selection unit 213 according to said test data received from the clock pads 203_1 and 203_2. On the other hand, the selection unit 213 selects and outputs the write clock signal CLK_W' to the delay unit 214 and the write clock generation unit 216 during the second test mode. The delay unit 214 delays and outputs the write clock signal CLK_W' to the write clock generation unit 216. Accordingly, the write clock generation unit 216 generates the write clock signal CLK_W based on the write clock signal CLK_W', and the write clock signal CLK_W is outputted to the data register 222_4 for testing the first test loop. Accordingly, the electric elements located in the second loop are tested at high speed under the second test mode.

In this embodiment, the input/output pads I/O_(N−1) and I/O_N are respectively connected with the clock pads 203_2 and 203_3 via the traces 414 and 412 to form the second test loop, but the invention is not limited thereto. In other embodiments, the clock pads 203_2 and 203_3 may respectively connect with other two input/output pads to form the second test loop except for the input/output pads I/O_(N−1) and I/O_N.

Figure 2:
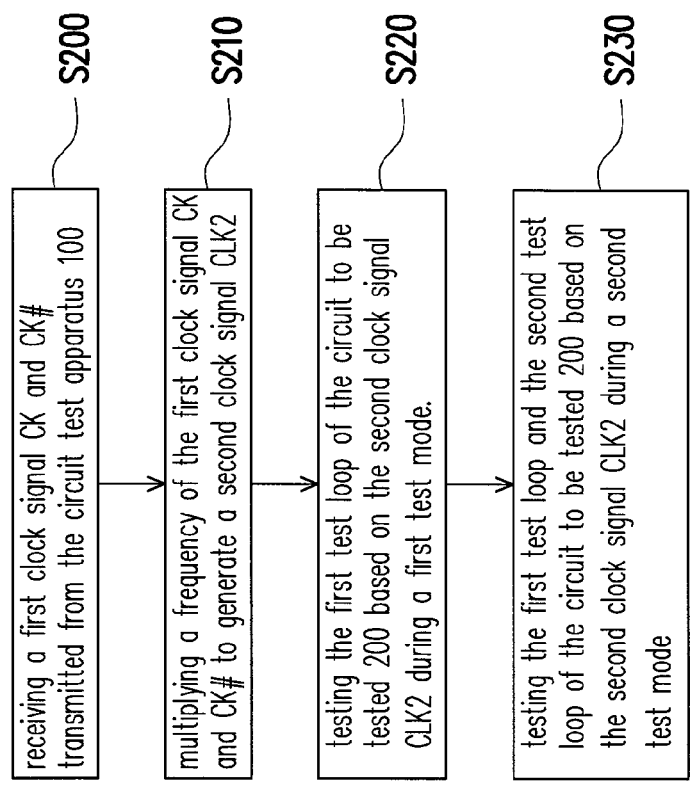
FIG. 2 is a flowchart of a circuit test method according to an embodiment of the invention.

FIG. 2 is a flowchart of a circuit test method according to an embodiment of the invention. With reference to FIG. 1 and FIG. 2, the circuit test method of this embodiment includes following steps. In step S200, the first clock signal CK and CK# transmitted from the circuit test apparatus 100 is received. Next, the frequency of the first clock signal is multiplied to generate the second clock signal CLK2 for the high speed circuit testing in step S210. In this embodiment, the second clock signal CLK2 has a frequency higher than that of the first clock signal CK and CK#. Thereafter, the first test loop is tested based on the second clock signal CLK2 during the first test mode in step S220. Next, the first test loop and the second test loop are tested based on the second clock signal CLK2 during a second test mode in step S230. It should be noted that the order of steps S220 and S230 performed in this embodiment may change, and the invention is not limited thereto. Step S230 may be performed before step S220 in another embodiment.

Besides, the circuit test method described in this embodiment of the invention is sufficiently taught, suggested, and embodied in the embodiments illustrated in FIG. 1, and therefore no further description is provided herein.

In summary, in the exemplary embodiments of the invention, the test loops are formed from one input/output pad back to another input/output pad, and certain two input/output pads are chosen to drive specific data patterns to generate the write clock signal. The selection unit selects the clock source from the output of the clock multiplying unit or the write clock transmitted from the clock pads via the input/output interface unit under different test modes. No high speed tester apparatus is needed in the exemplary embodiments of the invention. The electric elements located in the first test loop and the second test loop are tested at high speed.

Although the invention has been described with reference to the above embodiments, it will be apparent to one of ordinary skill in the art that modifications to the described embodiment may be made without departing from the spirit of the invention. Accordingly, the scope of the invention will be defined by the attached claims not by the above detailed descriptions.

What is claimed is:

1. A circuit test system, comprising:
a circuit test apparatus providing a first clock signal; and
a circuit to be tested coupled to the circuit test apparatus, wherein the circuit to be tested comprising:
a plurality of input/output pads, wherein at least two first input/output pads of the input/output pads are connected to each other to form a first test loop during a first test mode;
at least one first clock pad receiving the first clock signal; and
at least one second clock pad connected to at least one second input/output pad of the input/output pads to form a second test loop during a second test mode,
wherein the circuit to be tested multiplies a frequency of the first clock signal to generate a second clock signal, and the first test loop of the circuit to be tested is tested based on the second clock signal during the first test mode, and the first test loop and the second test loop of the circuit to be tested are tested based on the second clock signal during the second test mode,
wherein during the second test mode, a read clock is generated based on the second clock signal, outputted from a clock generation unit, and transmitted through a data register unit, a transmission unit of one of the at least two first input/output pads, the at least two first input/output pads, and a reception unit of another one of the at least two first input/output pads in the first test loop, and back to the data register unit,
wherein during the second test mode, the read clock is outputted from the clock generation unit, and transmitted through the data register unit, the transmission unit of the at least one second input/output pad, the at least one second input/output pad, the at least one second clock pad, and a reception unit of the at least one second clock pad in the second test loop, and back to the clock generation unit.

2. The circuit test system as claimed in claim 1, wherein the circuit to be tested further comprises:
a plurality of input/output interface units each coupled to the corresponding one of the input/output pads or the at least one second clock pad for transmitting data to the corresponding input/output pad and receiving data from the corresponding input/output pad or the at least one second clock pad.

3. The circuit test system as claimed in claim 2, wherein each of the input/output interface units coupled to the corresponding one of the input/output pads comprises:
the reception unit coupled to the corresponding input/output pad and receiving data from the corresponding input/output pad; and
the transmission unit coupled to the corresponding input/output pad and transmitting data to the corresponding input/output pad,
wherein the transmission unit of the one of the at least two first input/output pads is located in the first test loop, and the reception unit of the another one of the at least two first input/output pads is located in the first test loop.

4. The circuit test system as claimed in claim 2, wherein the input/output interface unit coupled to the at least one second clock pad comprises:
the reception unit coupled to the at least one second clock pad and receiving data from the at least one second clock pad,
wherein the reception unit of the at least one second clock pad is located in the second test loop.

5. The circuit test system as claimed in claim 2, wherein the circuit to be tested further comprises:
the data register unit coupled to the input/output interface units, receiving data from the input/output interface units based on a first write clock, and outputting data to the input/output interface units based on the read clock.

6. The circuit test system as claimed in claim 5, wherein the circuit to be tested further comprises:
the clock generation unit coupled between the data register unit and the circuit test apparatus, multiplying the frequency of the first clock signal to generate the second clock signal, and providing the second clock signal to serve as the first write clock and the read clock.

7. The circuit test system as claimed in claim 6, wherein the clock generation unit comprises:
a clock multiplying unit coupled to the circuit test apparatus and multiplying the frequency of the first clock signal to generate the second clock signal;
a read clock generation unit coupled to the data register unit and providing the read clock based on the second clock signal; and
a write clock generation unit coupled to the data register unit and providing the first write clock based on the second clock signal or a second write clock.

8. The circuit test system as claimed in claim 7, wherein the clock generation unit further comprises:
a selection unit coupled between the clock multiplying unit and the write clock generation unit, selecting one of the second clock signal and the second write clock, and providing the selected one to the write clock generation unit,
wherein the second write clock is transmitted from the second test loop to the selection unit.

9. The circuit test system as claimed in claim 7, wherein the clock generation unit further comprises:
a delay unit coupled between the write clock generation unit and the clock multiplying unit and delaying the second clock signal or the second write clock for an adjustable period.

10. A circuit test method, adapted to test a circuit to be tested, wherein the circuit to be tested comprises a first test loop and a second test loop, the circuit test method comprising:
receiving a first clock signal from a circuit test apparatus;
multiplying a frequency of the first clock signal to generate a second clock signal;
testing the first test loop of the circuit to be tested based on the second clock signal during a first test mode; and
testing the first test loop and the second test loop of the circuit to be tested based on the second clock signal during a second test mode,
wherein during the second test mode, a read clock is generated based on the second clock signal, outputted from a clock generation unit, and transmitted through a data register unit, a first transmission unit, at least two first input/output pads, and a first reception unit in the first test loop, and back to the data register unit,
wherein during the second test mode, the read clock is outputted from the clock generation unit, and transmitted through the data register unit, a second transmission unit, at least one second input/output pad, at least one clock pad, and a second reception unit in the second test loop, and back to the clock generation unit.

11. The circuit test method as claimed in claim 10, wherein the step of testing the first test loop of the circuit to be tested based on the second clock signal during the first test mode comprises:

providing the read clock and a first write clock to the first test loop based on the second clock; and transmitting data from the data register unit to the first transmission unit, the at least two first input/output pads, the first reception unit, and back to the data register unit based on the read clock and the first write clock, wherein the data register unit, the first transmission unit, the at least two first input/output pads, and the first reception unit are located in the first test loop, the first transmission unit is coupled to one of the at least two first input/output pads, the first reception unit is coupled to another one of the at least two first input/output pads, and the at least two first input/output pads are connected to each other.

12. The circuit test method as claimed in claim 11, wherein the step of testing the first test loop of the circuit to be tested based on the second clock signal during the first test mode further comprises:

delaying the second clock signal for an adjustable period to provide the first write clock.

13. The circuit test method as claimed in claim 10, wherein the step of testing the first test loop and the second test loop of the circuit to be tested based on the second clock signal during the second test mode comprises:

providing the read clock and a first write clock to the first test loop based on the second clock; and transmitting data from the data register unit to the first transmission unit, the at least two first input/output pads, the first reception unit, and back to the data register unit based on the read clock and the first write clock, wherein the data register unit, the first transmission unit, the at least two first input/output pads, and the first reception unit are located in the first test loop, the first transmission unit is coupled to one of the at least two first input/output pads, the first reception unit is coupled to another one of the at least two first input/output pads, and the at least two first input/output pads are connected to each other.

14. The circuit test method as claimed in claim 13, wherein the step of testing the first test loop and the second test loop of the circuit to be tested based on the second clock signal during the second test mode further comprises:

delaying the second clock signal for an adjustable period to provide the first write clock.

15. The circuit test method as claimed in claim 13, wherein the step of testing the first test loop and the second test loop of the circuit to be tested based on the second clock signal during the second test mode further comprises:

providing the read clock to the second test loop based on the second clock; and transmitting data from the data register unit to the second transmission unit, the at least one second input/output pad, the at least one clock pad, the second reception unit, and back to the clock generation unit based on the read clock, wherein the data register unit, the second transmission unit, the at least one second input/output pad, the at least one clock pad, and the second reception unit are located in the second test loop, the second transmission unit is coupled to the at least one second input/output pad, the second reception unit is coupled to the at least one clock pad, and the at least one second input/output pad and the at least one clock pad are connected to each other.

16. The circuit test method as claimed in claim 15, wherein the step of testing the first test loop and the second test loop of the circuit to be tested based on the second clock signal during the second test mode further comprises:

providing a second write clock to serve as the write clock, wherein the second write clock is transmitted from the second test loop to the first test loop.

17. The circuit test method as claimed in claim 16, wherein the step of testing the first test loop and the second test loop of the circuit to be tested based on the second clock signal during the second test mode further comprises:

delaying the second write clock for an adjustable period to serve as the first write clock.

* * * * *